(12) United States Patent
Shimodaira

(10) Patent No.: US 7,429,814 B2
(45) Date of Patent: Sep. 30, 2008

(54) APPARATUS AND METHODS FOR MANUFACTURING A PIEZOELECTRIC RESONATOR DEVICE

(75) Inventor: Kazuhiko Shimodaira, Nagano-ken (JP)

(73) Assignee: Seiko Epson Corporation, Tokyo (JP)

( * ) Notice: Subject to any disclaimer, the term of this patent is extended or adjusted under 35 U.S.C. 154(b) by 1373 days.

(21) Appl. No.: 10/278,971

(22) Filed: Oct. 24, 2002

(65) Prior Publication Data

US 2007/0200461 A1    Aug. 30, 2007

(51) Int. Cl.
H01L 41/053 (2006.01)
(52) U.S. Cl. ................................ 310/344; 310/348
(58) Field of Classification Search ............... 310/344, 310/348
See application file for complete search history.

(56) References Cited

U.S. PATENT DOCUMENTS

| | | | | |
|---|---|---|---|---|
| 5,138,214 | A * | 8/1992 | Nakai et al. | 310/312 |
| 6,057,597 | A * | 5/2000 | Farnworth et al. | 257/710 |
| 6,229,249 | B1 * | 5/2001 | Hatanaka et al. | 310/348 |
| 6,541,897 | B2 * | 4/2003 | Endoh | 310/344 |
| 6,734,605 | B2 * | 5/2004 | Kinoshita | 310/348 |
| 2003/0045181 | A1 * | 3/2003 | Okazaki | 439/894 |
| 2005/0012559 | A1 * | 1/2005 | Shimodaira et al. | 331/158 |

FOREIGN PATENT DOCUMENTS

| | | | |
|---|---|---|---|
| FR | 0167055 | * | 1/1986 |
| JP | A-03-243010 | | 10/1991 |
| JP | A-08-316732 | | 11/1996 |
| JP | A-09-121120 | | 5/1997 |
| JP | A-09-298440 | | 11/1997 |
| JP | A-2000-106515 | | 4/2000 |
| JP | A 2000-269741 | | 9/2000 |
| JP | A-2000-307368 | | 11/2000 |
| JP | 2002-118423 | * | 4/2002 |
| JP | 2002-280865 | * | 9/2002 |

* cited by examiner

*Primary Examiner*—Thomas M Dougherty
(74) *Attorney, Agent, or Firm*—Oliff & Berridge, PLC

(57) ABSTRACT

The invention provides a piezoelectric resonator device having excellent frequency accuracy and aging characteristics. The piezoelectric resonator element can be packaged in an exclusive hollow space formed in the package in advance to packaging an IC chip. After mounting a lid on the opening of the hollow space while the hollow space is in communication with an external atmosphere, the external conduit is shut in vacuum and the hollow space for packaging the resonator element is tightly sealed, and an IC chip is packaged after an optimality discrimination treatment of the piezoelectric resonator element. The piezoelectric resonator element is formed into a tuning fork type resonator element, and the lid is made of a glass. The conduit to the external atmosphere is shielded by embedding with a gold base material to capture the materials scattered by frequency adjustment of the piezoelectric resonator element.

4 Claims, 5 Drawing Sheets

FIG.2
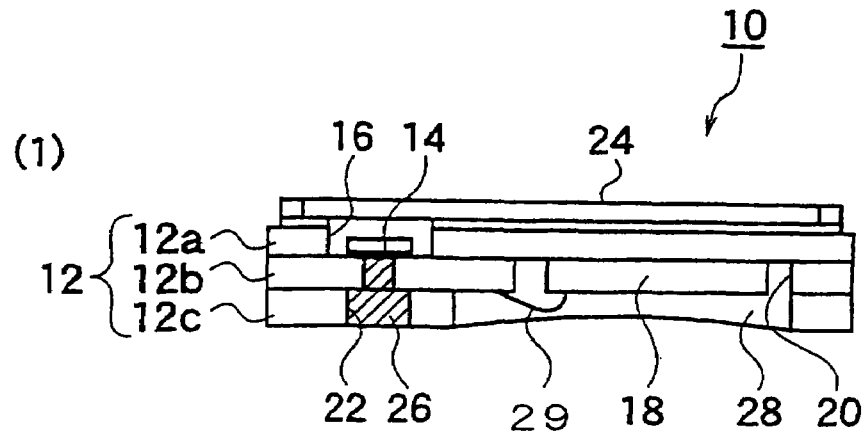
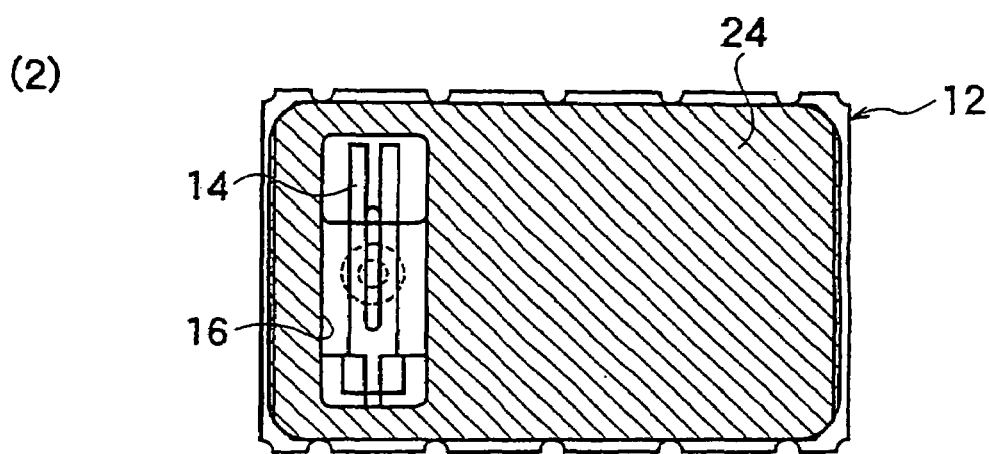
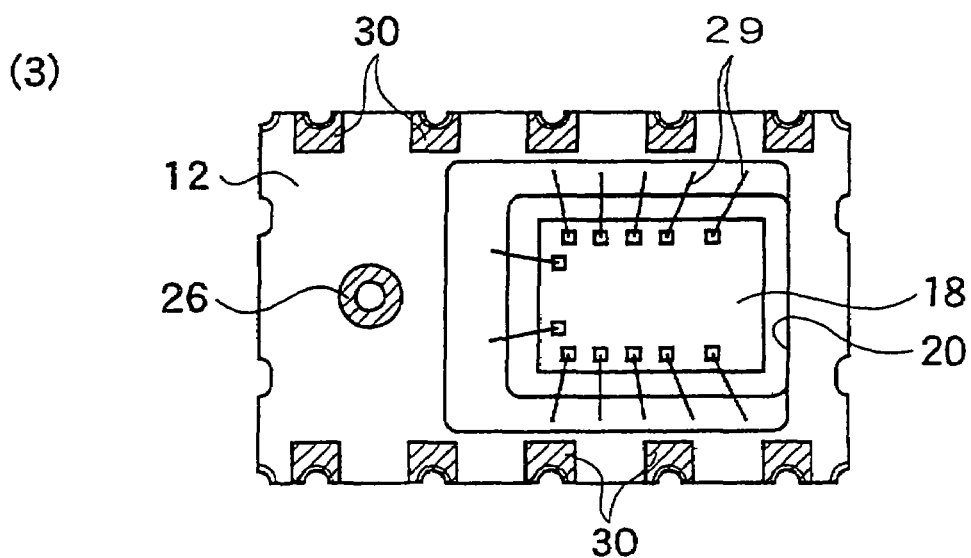

FIG.3
(1)
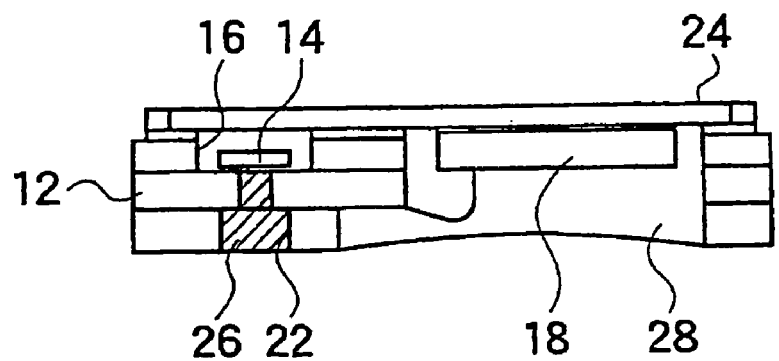
(2)
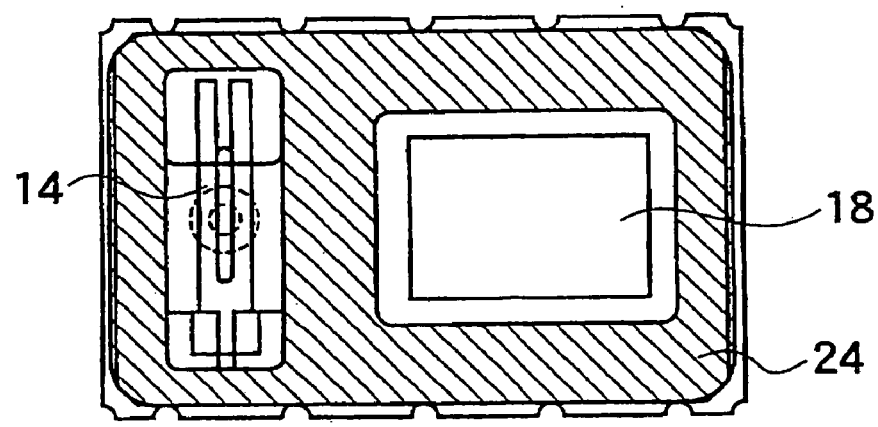
(3)
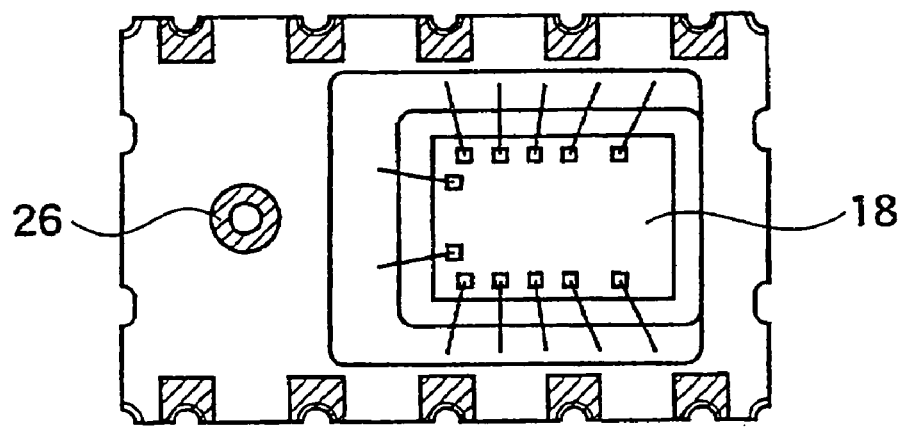

APPARATUS AND METHODS FOR MANUFACTURING A PIEZOELECTRIC RESONATOR DEVICE

BACKGROUND OF THE INVENTION

1. Field of Invention

The present invention relates to a piezoelectric resonator device, a method for manufacturing the same, a ceramic package and a real time clock.

2. Description of Related Art

Currently, an IC chip and a quartz crystal oscillator are usually packaged in a hollow space formed on a ceramic package of a ceramic package type quartz oscillator. The ceramic package having a hollow space structure for housing these packaging members is usually used for a device for packaging an AT cut resonator element, and can include a laminated structure having three to five layers.

However, since a device provided with a tuning fork type piezoelectric resonator element is required to house the resonator element in vacuum, a cylinder type resonator is usually used for fixing the resonator in an evacuated cylinder. The resonator is constructed as a piezoelectric resonator device totally molded with a resin together with an IC chip for exciting the resonator. The molded resonator is shown in FIG. 6. In this structure, a tuning fork type resonator element 2 is packaged by housing in an evacuated cylinder 1, the cylinder 1 is disposed in adjoining relation to the IC chip 3, and the entire device is enclosed with a resin mold 4 while pulling out electrode terminals 5 out of the external sides thereof to manufacture a package.

Japanese Unexamined Utility Model Registration Application Publication No. 54-35870 is an example of the technical document related to the above technique.

SUMMARY OF THE INVENTION

In an attempt for forming a small size tuning fork type resonator device provided with the tuning fork type resonator element, the thickness of the device cannot be reduced to be smaller than the thickness of the cylinder vessel, and the planar area of the device also becomes large depending on the size of the cylinder when the IC chip is provided together with the cylinder. The following problems can arise, on the other hand, when the tuning fork type resonator element is packaged in a hollow space formed at the center of the ceramic package together with the IC chip.

In other words, when the tuning fork type resonator element and IC chip are sealed together in the ceramic package in vacuum, the gas occluded in the package is discharged into the vacuum chamber in which the resonator element is packaged to reduce the degree of vacuum, and to deteriorate the characteristics of the tuning fork type resonator element.

Since the tuning fork type resonator element and IC chip are sealed in vacuum after packaging, the IC chip having no defects is forced to be abandoned when the tuning fork type resonator element is defective, because the tuning fork type resonator element cannot be determined to be good or defective before packaging and after vacuum sealing of the tuning fork type resonator element. In addition, it is also a problem that CI values of the tuning fork type resonator element cannot be measured by the influence of the IC chip.

When a transparent glass is used for a lid for frequency adjustment thereafter, a light-shielding treatment is required for protecting the surface of the IC chip since the glass is transparent.

The surface side of the IC chip becomes poor in heat dissipation performance due to the space formed therein with a heat dissipation action only on the back face of the IC chip, thereby deteriorating the heat dissipation effect. As a result, the amount of heat transferred from the back face of the IC chip to the packaged piezoelectric resonator element is large, since the resonator element is located near the IC chip for satisfying the requirement of small and thin size package.

Reliability of connection between the aluminum pad of the IC chip and Au ball may be decreased since the IC chip is heated, for example, at 350° C. or more for sealing with a low melting point glass. Accordingly, the IC chip should be sealed with the low melting point glass in a period as short as possible and at a temperature as low as possible. An aluminum wire bonding is used when a high temperature or a long period of time is required for sealing with the low melting point glass.

An object of the present invention, carried out by noticing at least the conventional problems as hitherto described, is to provide a piezoelectric resonator device excellent in frequency accuracy and aging characteristics and a method for manufacturing the device, and a ceramic package and real time clock without decreasing the degree of vacuum of the mounted resonator element, particularly in the device using a tuning fork type resonator element. It is another object of the present invention to improve the production yield by enabling the IC chip to be packaged on a successful package after packaging the resonator element. It is a different object of the present invention to avoid the resonator characteristics from being deteriorated by increasing the heat dissipation effect.

The present invention for attaining the foregoing objects provides a method for manufacturing a piezoelectric resonator device that can include the steps of packaging a piezoelectric resonator element in an exclusive hollow space formed on a package prior to packaging an IC chip, mounting a lid on the opening of the hollow space while permitting the follow space to communicate with an external atmosphere, tightly sealing the hollow space for mounting the resonator element by closing a conduit to an external atmosphere in vacuum, and packaging the IC chip after an optimality discrimination treatment of the piezoelectric resonator element.

The present invention also provides a method for manufacturing a piezoelectric resonator device that can include the steps of packaging a piezoelectric resonator element in a first follow space formed on a package, attaching a lid while permitting the first follow space to communicate with an external atmosphere, shielding and tightly sealing a conduit to the external atmosphere provided in the first follow space in vacuum, and packaging an excitation IC chip in a second follow space formed on the package after an optimality discrimination treatment of the piezoelectric resonator element. The piezoelectric resonator element may be a tuning fork type resonator element. The lid may be a glass.

Preferably, the conduit to the external atmosphere is sealed by embedding with a gold based material to enable materials scattered by frequency adjustment of the piezoelectric resonator element to be captured.

The present invention also provides a method for manufacturing a piezoelectric resonator device that can include the steps of packaging a piezoelectric resonator element on a package on one face of which a hollow space is formed, sealing the hollow space by mounting a lid on an opening while permitting the hollow space to communicate with an external atmosphere, sealing a conduit to an external atmosphere in vacuum, testing the piezoelectric resonator element for its characteristics followed by packaging an IC chip for exciting the piezoelectric resonator element in a follow space formed independently from the follow space, and testing the article for its characteristics before or after sealing the IC chip with a resin.

The present invention also provides a piezoelectric resonator device having a hollow space for packaging a piezoelectric resonator element and a hollow space for packaging an excitation IC chip independently formed with each other on a package body, wherein a conduit for communicating with an external atmosphere to be embedded thereafter in vacuum is formed in the hollow space for packaging the piezoelectric resonator element, and the piezoelectric resonator element and exciting IC chip are independently packaged in respective hollow spaces.

The opening of the hollow space for packaging the resonator element and the opening of the hollow space for packaging the IC chip may be independently formed on the top face and bottom face of the package, respectively. Preferably, the package body is formed by laminating a plate on which the hollow space for packaging the piezoelectric resonator element is formed and a plate on which the space for packaging the IC chip for exciting the resonator element is formed, and packaging hollow spaces are formed on both plates.

Alternatively, the package body may include a plate on which the hollow space for packaging the piezoelectric resonator element and a perforated space for packaging the IC chip for exciting the resonator element are formed, and a lid laminated on the plate for closing the opening of the hollow space for packaging the piezoelectric resonator element to form a closed space for housing the piezoelectric resonator element. The hollow space for packaging the IC chip may be formed by closing one side of the hollow space for mounting the IC chip for exciting the resonator element using the lid for closing the packaging hollow space, and the IC chip may be mounted on the inner face of the lid.

Preferably, the conduit to an external atmosphere is formed just under a frequency adjusting site of the piezoelectric resonator element.

The present invention provides a ceramic package for the piezoelectric resonator device having hollow spaces independently formed on the top and bottom faces of the package, respectively, wherein an opening to be tightly closed with a lid is formed on one of the hollow spaces with a conduit to an external atmosphere to be embedded thereafter in vacuum therein.

The present invention also provides a real time clock manufactured by packaging a piezoelectric resonator device that can include a hollow space for packaging a tuning fork type resonator element and a hollow space for packaging an excitation IC chip each independently formed on a package body. The resonator element is packaged in the hollow space for packaging the tuning fork type resonator element with a glass lid for sealing an opening provided thereafter, and the hollow space for packaging the tuning fork type resonator element can include a conduit to communicate with an external atmosphere that has been previously formed and is to be embedded after being shielded by embedding in vacuum, and wherein the IC chip for exciting the tuning fork type resonator element is independently packaged in another follow space.

BRIEF DESCRIPTION OF THE DRAWINGS

The invention will be described with reference to the accompanying drawings, wherein like numerals reference like elements, and wherein:

FIG. 2 shows the first embodiment of the piezoelectric resonator device according to the present invention, wherein FIG. 2(1) is a cross section, FIG. 2(2) is a plane view and FIG. 2(3) is a bottom view;

FIG. 3 shows the second embodiment of the piezoelectric resonator device according to the present invention, wherein FIG. 3(1) is a cross section, FIG. 3(2) is a plane view and FIG. 3(3) is a bottom view;

DETAILED DESCRIPTION OF PREFERRED EMBODIMENTS

Embodiments of the method for manufacturing a piezoelectric resonator device, a piezoelectric resonator device and a ceramic package, and a real time clock according to the present invention will be described hereinafter with reference to drawings.

Figure 1:
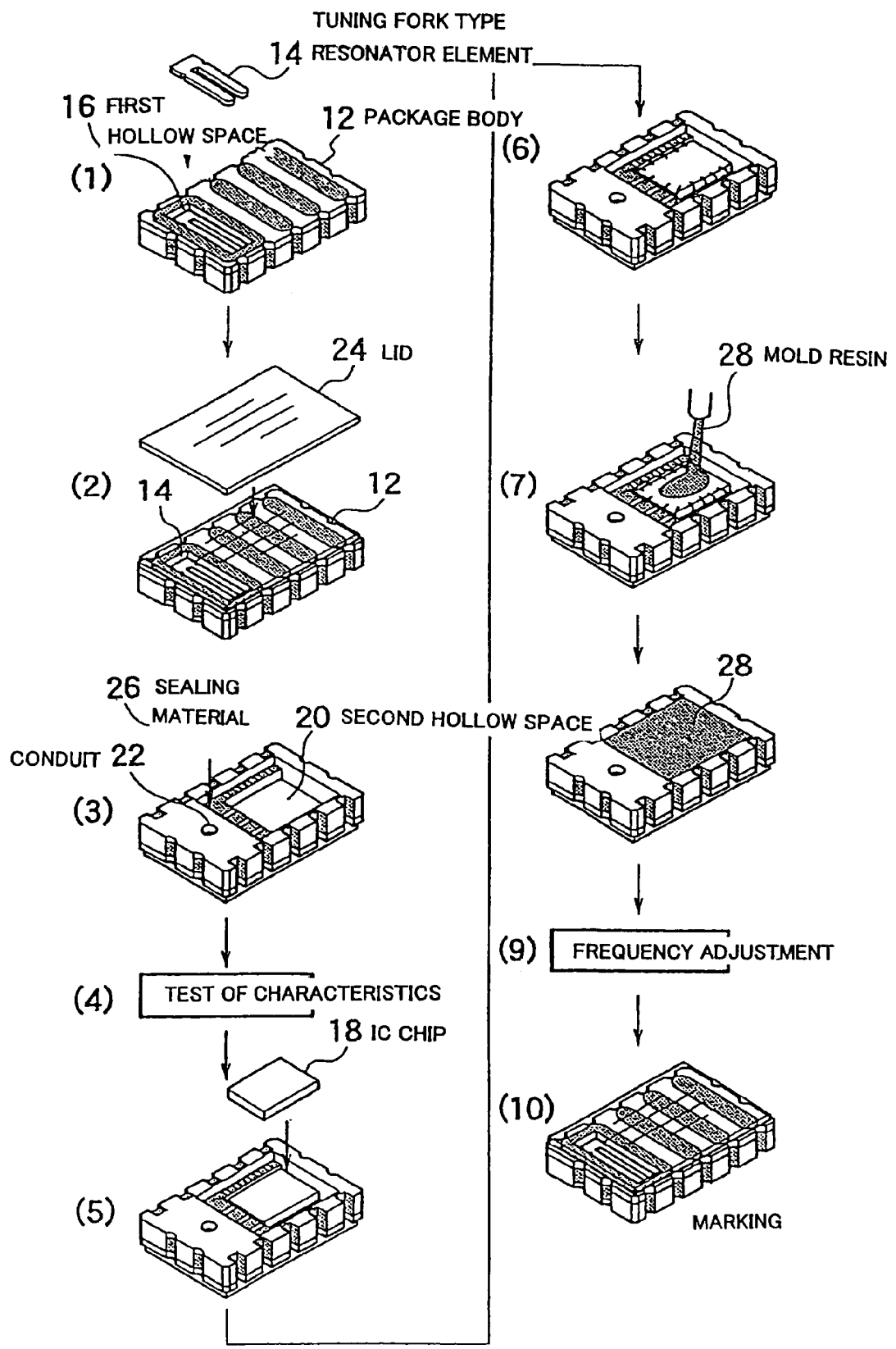
FIG. 1 is a process flow chart of the piezoelectric resonator device according to the embodiments of the present invention.

The piezoelectric resonator device according to the first embodiment of the present invention is shown in FIG. 2. FIG. 1(1) is a cross section of the device, FIG. 1(2) is a plane view of a lid side, and FIG. 1(3) shows a bottom face. As shown in the drawings, the piezoelectric resonator device 10 according to the first embodiment includes a package body 12 formed by laminating three layers of plates formed of ceramic insulating substrates, and a first hollow space 16 for mounting a tuning fork type resonator element 14 and a second hollow space 20 for packaging an IC chip 18 having an oscillation circuit are provided on the top and bottom faces of the package body, respectively, with their positions shifted in the right and left directions with each other.

For forming these hollow spaces 16 and 20, a first plate 12a on which a space for packaging the piezoelectric resonator element is formed and a second plate 12b on which a space for packaging the IC chip for exciting the resonator element is formed are laminated in the package body 12. The package body can also include a laminated third plate 12c for forming a resin molding space at the side of the second plate 12b. Packaging hollow spaces 16 and 20 are formed on both faces of the package body 12, respectively, by this laminated structure.

As will be described in greater detail below, the tuning fork type resonator element 14 is packaged in the exclusive hollow space 16 formed on the package body 12 prior to packaging the IC chip 18, and a lid 24 is mounted so as to cover the opening of the first hollow space 16 while permitting the first hollow space 16 to communicate with an external atmosphere through a conduit 22. Subsequently, the conduit 22 as an external communication passageway is shielded by closing it with a sealing material 26 including an Au—Sn alloy, Au—Ge alloy, or the like thereafter to tightly seal the first hollow space 16 for packaging the resonator element in vacuum. Then, the IC chip 18 is packaged in the second hollow space 20 after an optimality discrimination treatment of the tuning fork type resonator element 14, followed by filling a mold resin 28 in the second follow space 20.

The lid 24 is can be constructed of a glass to be bonded by lamination on the entire surface of the package body 12, and the sharp corners of the glass are rounded to avoid the glass from being broken as shown in FIG. 2(2). Since the tuning fork type resonator element 14 is a relatively small piece, it is packaged within the first follow space 16 formed at the biased side of the slender package body 12, and the glass lid 24 is laminated with bonding on the package body 12 with a larger junction area than the area of the first hollow space 16. As a result, the lid 24 is protected from being broken even by using a substantially thin glass plate. While the IC chip 18 is packaged in the second hollow space 20 formed on the opposed face of the package body 12, wires are bonded to the IC chip 18 after packaging. The second plate 12b is plated with a metal such as W (tungsten) or Mo (molybdenum), and input-output electrodes (not shown) are formed by plating with Ni and Au. These electrodes are electrically connected to wire bonding pads of the IC chip 18 with an Au bonding wire 29.

External terminals 30 are formed in the device 10 by through holes provided at the edge of the package body 12. These terminals are in particular pulled out from a circuit formed on the second plate 12b, and a variety of signals are imported and exported through the external terminals.

The steps for manufacturing the piezoelectric resonator device 10 will be described with reference to FIG. 1. In the first step, the tuning fork type resonator element 14 is packaged in the first hollow space 16 formed on the ceramic package body 12 using an Ag paste, followed by drying (FIG. 1(1)). After drying the bonded portion, a lid 24 including a glass is laminated on the surface of the package body 12 so as to cover and seal the opening of the first hollow space 14 (FIG. 1(2)). Gases are discharged from the package body 12 and adhesive by heating process since the bonding temperature is raised to about 320° C. for mounting the lid 24. However, since the inside of the first hollow space 16 is communicating with the outside through a conduit 22, the discharged gas flows out to the outside. Consequently, the gas does not reside in the first hollow space 16 to protect the characteristics of the tuning fork type resonator element 14 from being changed by adsorption of the gas.

After mounting the lid 24, moisture occluded in the package body is scattered off by previously heat-treating the package body 12. Then, the package body 12 is placed in vacuum, and a hole sealing material 26 comprising an Au—Ge ball is placed on the conduit 22 as shown in FIG. 1(3), and the conduit is tightly sealed by laser irradiation, thereby maintaining the inside of the first hollow space 16 in which the tuning fork type resonator element 14 is packaged in vacuum. After packaging and perfectly sealing the tuning fork type resonator element 14, the resonator element is tested for its characteristics (FIG. 1(4)) to judge whether the resonator element is good or defective by applying an optimality discrimination treatment for determining whether the resonator element falls within a range capable of frequency adjustment or not. NG articles are eliminated before packaging the IC element by this treatment, and the IC chip 18 is prevented from meaningless abandonment.

Only the package body 12 mounting the tuning fork type resonator element 14 that are determined to be good by the characteristic test proceeds to the next step. The IC chip 18 is fixed by adhering with an Ag paste by die-attaching within the second hollow space 20 after inverting the package body 12. After drying at a predetermined temperature, the IC chip is packaged by fixing in applying wire bonding (FIG. 1(6)).

A molding resin 28, such as an epoxy resin, is potted within the hollow space for packaging the IC chip thereafter (FIG. 1(7)) to complete resin sealing by drying and solidification (FIG. 1(8)). Frequency adjustment is applied to the article after sealing with the resin (FIG. 1(9)), wherein a laser beam is irradiated through the glass lid 24 while detecting output frequencies obtained by exciting the tuning fork type resonator element 14 with the IC chip 18, and weighing materials for adjusting the frequency are eliminated from the tuning fork. It can be desirable to capture the metallic weighing materials scattered by frequency adjustment of the tuning fork type resonator element 14 by placing the conduit 22 to the external atmosphere just under the elimination area, and by allowing the surface of the embedded gold based material, such as the Au—Ge ball, to face the conduit. After applying such frequency adjustment to a final article, a completed product is manufactured after marking (FIG. 1(10)).

According to the embodiment with respect to the piezoelectric resonator device 10 and the method for manufacturing the same, in the ceramic package body 12, the opening of the first hollow space 16 for packaging the tuning fork type resonator element 14 is disposed at the biased side on the surface of the package, and the conduit 22 perforated to the outside for vacuum sealing is disposed on the opening. Since the opening of the second follow space 20 for packaging the IC chip 18 is placed at the side of the area for packaging the tuning fork type resonator element on the back face of package body 12, the thickness for packaging becomes quite small with a small volume, enabling a piezoelectric resonator device with small size and small area to be obtained. It is also possible to construct a quite efficient piezoelectric resonator element by forming a resonance excitation electrode by providing a groove or slender hole on a resonating arm of the piezoelectric resonator element. The planar packaging area may be also sufficiently reduced by adopting such piezoelectric resonator element.

For packaging the resonator element, the tuning fork is bonded with an Ag paste (a silicone based paste) while forming the lid on the opening with a transparent glass plate, thereby avoiding the danger of breakage by reducing the bonding area on the hollow space. Furthermore, though the package and the glass are bonded using a low melting point glass, the resonator element 14 is little affected by the gas generated from the adhesive while reducing the effect for decreasing the degree of vacuum. The lid 24 has a size enough for covering the entire package body 12 with a larger solid bonding area than the area required for covering the first hollow space 16, thereby making the lid to have a high strength.

The inside of the resonator element packaging space is sealed by melting the sealing material 26 such as the Au—Sn ball or Au—Ge ball in irradiating a laser beam for evacuation in this embodiment. Consequently, the space can be evacuated after discharging the gas generated from the adhesives for the resonator element 14 and glass lid 24. Therefore, the resonator element 14 is efficiently protected from being deteriorated from adhesion of the gas.

Any defective quartz crystal resonator element may be detected by testing the characteristics of the resonator element 14 before packaging the IC chip 18. Consequently, meaningless abandonment of the resonator element 14 and IC chip 18 after packaging the IC chip 18 may be avoided. It is an advantage for packaging the IC chip 18 that the method for packaging the IC chip is not selective, since the IC chip 18 can be packaged by wire bonding using an Au wire or by edge bonding and flip chip bonding (FCB) using an Al wire. In addition, light is reliably shielded by sealing the IC chip 18 with a resin, and the weighing material at the tip of the tuning fork can be readily removed for adjusting the frequency by irradiating a laser beam through the glass lid 24. Since the frequency is adjusted by monitoring the oscillation frequency after assembling the article, commodities having a highly accurate oscillation frequency can be obtained irrespective of irregularity of the capacity of IC. Since heat and impact force has little influence in the adjustment step of the frequency, change of the frequency may be suppressed to a negligible level.

FIG. 3 shows a piezoelectric resonator device according to the second embodiment. The second embodiment differs from the first embodiment shown in FIG. 2 in that the packaging face of the IC chip 18 is placed on the inner face of the lid 24. The other constructions are the same as those in the first embodiment.

Figure 4:
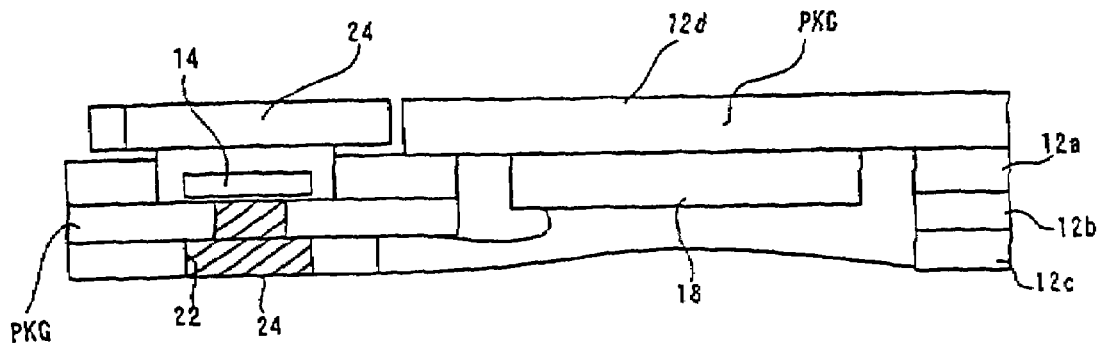
FIG. 4 shows a cross section of the piezoelectric resonator device according to the third embodiment of the present invention.

FIG. 4 shows a device according to the third embodiment, wherein the opening of the first hollow space 16 is covered with a glass lid 24, and the bottom of the second hollow space 20 is formed of a ceramic plate 12d instead of forming with the lid 24. The ceramic plate is made to be flush with the glass lid 24.

The devices according to the second and third embodiments can exert the same effect as in the first embodiment. It is an advantage of the second and third embodiments that the device is highly effective for forming a thin device.

Figure 5:
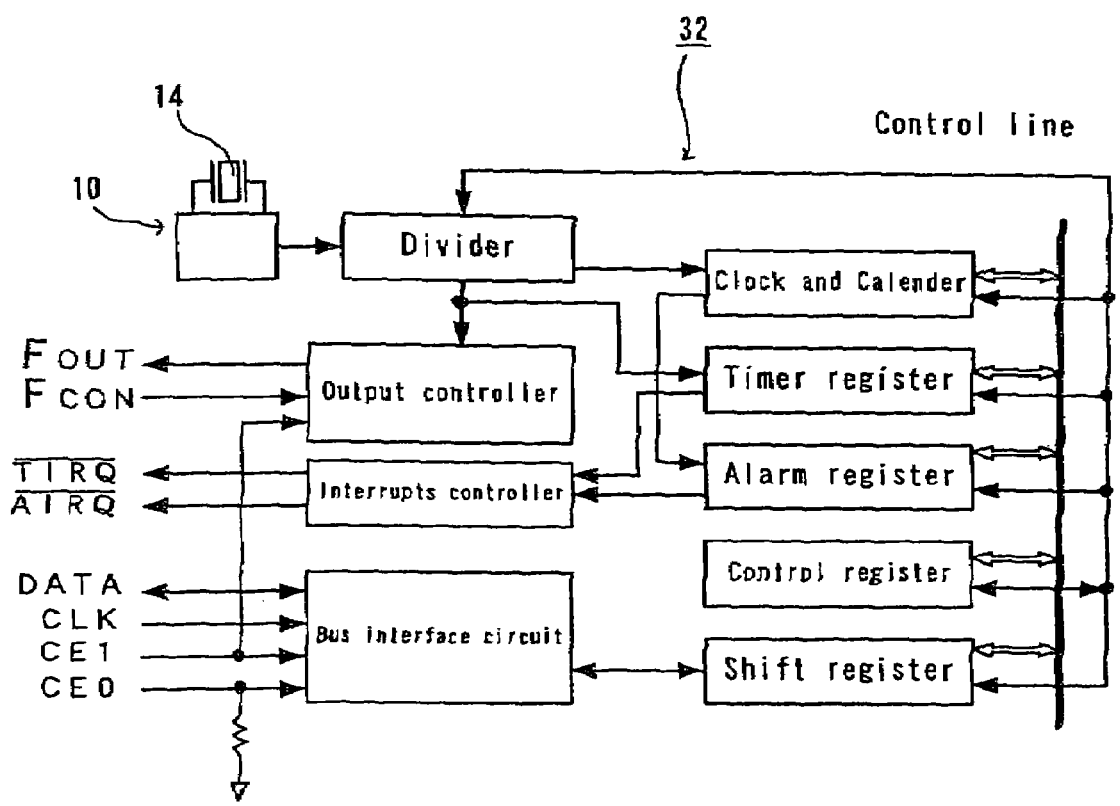
FIG. 5 shows a circuit construction of the real time clock according to the present invention.
Figure 6:
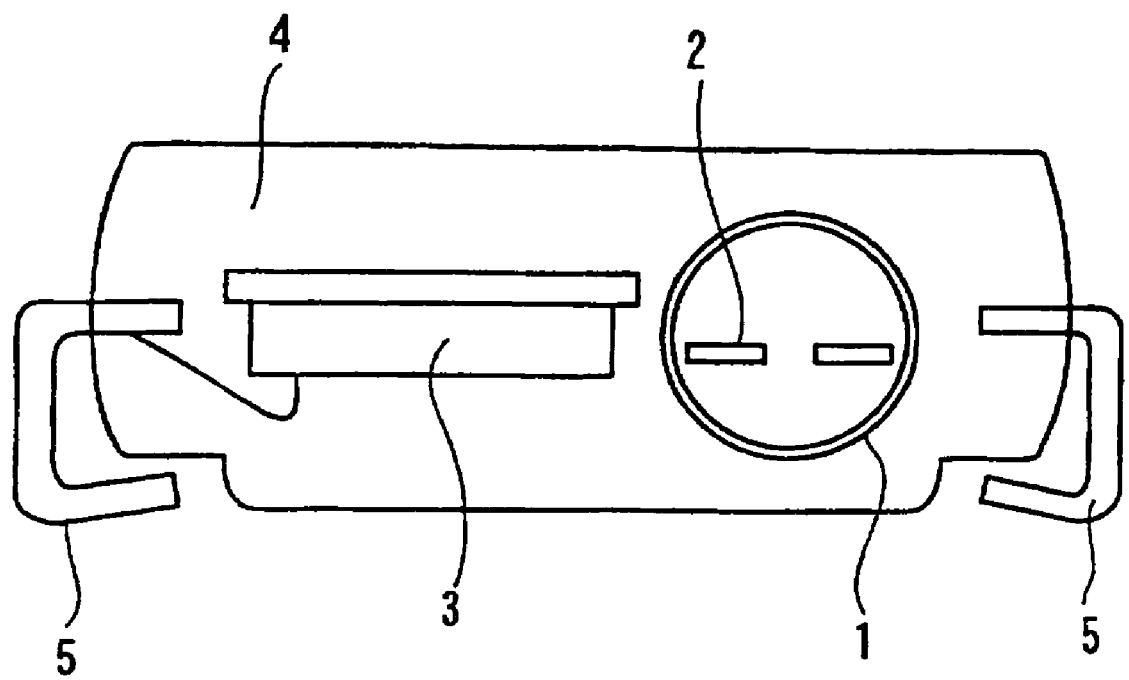
FIG. 6 is a cross section of the conventional tuning fork type resonator device.

A real time clock may be constructed by mounting the piezoelectric resonator device as described above. The construction of the circuit is shown in FIG. 5. As will be understood from FIG. 2(3), FIG. 3(3) and FIG. 5, the number of external connection terminals is large in the real time clock, which is different from other oscillators for general purposes. A small size and thin structure may be realized by using the device for the real time clock 32. The present invention provides a structure in which a number of external terminals can be provided irrespective of the small and thin size of the device. Accordingly, although the embodiment of the present invention was described as the real time clock, the present invention is suitable for providing a multi-output piezoelectric resonator device or various high performance piezoelectric resonator device.

While the example in which the tuning fork type resonator element is used as the piezoelectric resonator element was described in the foregoing embodiments, an AT cut resonator element may be also used. Evacuation of the inside of the first follow space 16 is not needed in this case, and nitrogen gas may be introduced using the conduit 22 after evacuation. A metallic lid may be used in place of the glass lid 24.

While an example in which the tuning fork type resonator element was used as the piezoelectric resonator element was described in the foregoing embodiments, a piezoelectric resonator element having a resonating arm in vacuum may be used as well.

As hitherto described, the present invention can provide a piezoelectric resonator device being excellent in frequency accuracy and aging characteristics, a method for manufacturing the same, a ceramic package and a real time clock without decrease the degree of vacuum of the packaged resonator element and deterioration of the characteristics of the resonator element. Production yield may be improved by permitting only a good IC chip to be packaged after packaging the resonator element, while enabling the accuracy of the resonator to be prevented from being deteriorated by improving heat dissipation effect.

While this invention has been described in conjunction with the specific embodiments thereof, it is evident that many alternatives, modifications, and variations will be apparent to those skilled in the art. Accordingly, preferred embodiments of the invention as set forth herein are intended to be illustrative, not limiting. There are changes that may be made without departing from the spirit and scope of the invention.

What is claimed is:

1. A piezoelectric resonator device having a piezoelectric resonator element and an excitation IC chip mounted on a package body thereof, comprising:
   a first plate having a first opening; and
   a second plate having a conduit formed such that the conduit is overlapped with the first opening in a plane view direction from a top side of the package body and a second opening formed such that the conduit is not overlapped with the second opening in the plane view direction, wherein
   the piezoelectric resonator element is mounted in a first hollow space formed by the first opening and the second plate in the package body,
   the excitation IC chip is mounted in a second hollow space formed by the second opening and the first plate in the package body, and
   the first opening is covered with a lid, the conduit is covered with a sealing material, and the first hollow space is sealed.

2. A piezoelectric resonator device having a piezoelectric resonator element and an excitation IC chip mounted on a package body thereof, comprising:
   a first plate having a first opening and a second opening, each formed such that the first opening does not overlap with the second opening in a plane view direction from a top side of the package body;
   a second plate having a conduit formed such that the conduit is overlapped with the first opening in the plane view direction and the conduit is not overlapped with the second opening in the plane view direction; and
   a lid laminated on the first plate, wherein
   the piezeoelectric resonator element is mounted in a first hollow space formed by the first opening and the second plate in the package body,
   the excitation IC chip is mounted in a second hollow space formed by the second opening in the package body,
   the first opening is covered with the lid, the conduit is covered with a sealing material, and the first hollow space is sealed to form a closed space for housing the resonator element, and
   the second opening is covered with the lid, the IC chip being packaged on an inner face of the lid.

3. The piezoelectric resonator device according to claim 2, the conduit to the external atmosphere being formed just under a frequency adjusting part of the piezoelectric resonator element.

4. A real time clock having a tuning fork type piezoelectric element and an excitation IC chip mounted on a package body thereof, comprising:
   a first plate having a first opening; and
   a second plate having a conduit formed such that the conduit is overlapped with the first opening in a plane view direction from a top side of the package body and a second opening formed such that the conduit is not overlapped with the second opening in the plane view direction, wherein
   the tuning fork type piezoelectric resonator element is mounted in a first hollow space formed by the first opening and the second plate in the package body,
   the excitation IC chip is mounted in a second hollow space formed by the second opening and the first plate in the package body, and
   the first opening is covered with a glass lid, the conduit is covered with a sealing material, and the first hollow space is sealed.

* * * * *

UNITED STATES PATENT AND TRADEMARK OFFICE
CERTIFICATE OF CORRECTION

| | | |
|---|---|---|
| PATENT NO. | : 7,429,814 B2 | Page 1 of 1 |
| APPLICATION NO. | : 10/278971 | |
| DATED | : September 30, 2008 | |
| INVENTOR(S) | : Kazuhiko Shimodaira | |

It is certified that error appears in the above-identified patent and that said Letters Patent is hereby corrected as shown below:

Title page, column 1, please insert the following:

--(30)  Foreign Application Priority Data
  Oct. 31, 2001  (JP)…………….2001-334144
  Sep. 10, 2002  (JP)……………..2002-264141--

Signed and Sealed this

Thirtieth Day of December, 2008

JON W. DUDAS
*Director of the United States Patent and Trademark Office*